US005604756A

United States Patent [19]

Kawata

[11] Patent Number: 5,604,756

[45] Date of Patent: Feb. 18, 1997

[54] TESTING DEVICE FOR CONCURRENTLY TESTING A PLURALITY OF SEMICONDUCTOR MEMORIES

[75] Inventor: Yasuhiro Kawata, Gyoda, Japan

[73] Assignee: Advantest Corporation, Tokyo, Japan

[21] Appl. No.: 347,300

[22] PCT Filed: Apr. 15, 1994

[86] PCT No.: PCT/JP94/00632

§ 371 Date: Dec. 1, 1994

§ 102(e) Date: Dec. 1, 1994

[87] PCT Pub. No.: WO94/24674

PCT Pub. Date: Oct. 27, 1994

[30] Foreign Application Priority Data

Apr. 15, 1993 [JP] Japan .................................... 5-024903

[51] Int. Cl.[6] ........................................................ G06F 7/02

[52] U.S. Cl. .......................... 371/67.1; 371/21.1; 371/27; 371/21.3

[58] Field of Search .......................... 371/67.1, 27, 21.3, 371/48, 21.1, 40.1, 15.1; 365/201

[56] References Cited

U.S. PATENT DOCUMENTS 5,062,109 10/1991 Ohshima et al. ...................... 371/21.2

5,214,654 5/1993 Oosawa .................................. 371/21.1

5,410,687 4/1995 Fujisaki et al. ......................... 395/575

FOREIGN PATENT DOCUMENTS 53-108248 9/1978 Japan .

59-77366 5/1984 Japan .

63-157400 6/1988 Japan .

*Primary Examiner*—Robert W. Beausoliel, Jr.

*Assistant Examiner*—Phung My Chung

*Attorney, Agent, or Firm*—Staas & Halsey

[57] ABSTRACT

A test data pattern, an address pattern and a control signal are applied to a memory under test (MUT) from a pattern generator (2). Data read out of the memory under test and expected data are compared by a logic comparator (4), which outputs a comparison signal indicating PASS or FAIL depending upon they match or not. When the logic comparator detect the match, the comparison signal is held in a register (42), from which it is outputted as an inhibit signal. The inhibit signal is applied to an inhibit gate (44) to cause it to inhibit the passage therethrough of a write enable signal to the memory under test, thereby preventing an excessive write in the memory.

8 Claims, 5 Drawing Sheets

TIMING GENER-ATIR
10
CK
PATTERN GENER-ATOR
2
MF
ADRS
TPD
CS
WAVE-FORM SHAPER
3
FAIL ANALYSIS MEMORY
5
FAIL
n
DR
MUT1
MUT2
MUTn-1
MUTn
A
DI
DO
R/W
RD
40
LOGICAL COMPARISON PART
ED
STRB

WAVE-
FORM
SHAPER
3
CS
DR1
DR2
DRn-1
DRn
MUT1
MUT2
MUTn-1
MUTn
WE
RD
40
41
42
4n-1
4n
4x
43
VOH
VOL
STRB
ED
SAME AS ABOVE
MF
F/P
0 : PASS
1: FAIL

MF
F/P
F/P
40
43
W
S
R
Q
S
R
Q
41
LCMP
421
INHWE
CLR
42
LCMP
422
INHWE
CLR
MUT1
MUT2
DR1
DR
441
442
WAVE-
FORM
SHAPER
3
PG
CLR
2
TIMING
GENER-
ATOR
10

TESTING DEVICE FOR CONCURRENTLY TESTING A PLURALITY OF SEMICONDUCTOR MEMORIES

TECHNICAL FIELD

The present invention relates to equipment for testing a semiconductor memory such as a DRAM (dynamic random access memory), a SRAM (static random access memory), a flash memory or the like, and more particularly, but not exclusively, to such memory testing equipment which is capable of concurrently testing a plurality of semiconductor flash memories as well as ordinary DRAMs and SRAMs.

FIG. 1 shows the basic construction of conventional semiconductor memory testing equipment. The semiconductor memory testing equipment comprises a timing generator 10, a pattern Generator 2, a waveform shaper 3, drivers DR, a logical comparison part 40 and a fail analysis memory 5 and carries out a test on a memory under test MUT. When the testing equipment is used only to make a pass/fail test of a semiconductor memory, however, there are cases where the fail analysis memory 5 is not used.

The pattern generator 2 responds to a reference clock CK from the timing generator 10 to output an address signal ADRS, a test data signal TPD and a control signal CS which are fed to the memory under test MUT. These signals are each shaped by the waveform shaper 3 into logical form necessary for test and rendered by the driver DR into a drive waveform of an actually required voltage, thereafter being applied to the memory MUT.

The test data signal TPD is written into or read out of the memory MUT under the control of the control signal CS. A test data signal RD read out of the memory MUT is provided to the logical comparison part 40, which compares expected data ED from the pattern generator 2 and the read-out test data RD to conduct a pass/fail test on the memory MUT depending upon whether they match or not.

When they do not match, the logical comparison part 40 applies a fail signal to the fail analysis memory 5 and the fail information is stored in that one of memory cells in the fail analysis memory 5 which is specified by the address signal ADRS from the pattern generator 2. After completion of the test, the stored contents of the fail analysis memory 5 are analyzed.

With a view to improving the test efficiency, it is a general practice in the actual line to do simultaneous, parallel testing of a plurality of memories $MUT_1$ through $MUT_n$.

Now, a description will be given of the flash memory.

In recent years, the flash memory has attracted attention as a non-volatile memory which is large-capacity and rewritable a number of times. Because of a specific structure of the flash memory, data cannot always be successfully written in each address by one write operation; hence, the write operation usually needs to be repeated a plurality of times. The number of times the write operation needs to be carried out until the write can be effected successfully varies with the kind of the memory MUT and even in the same kind of memory MUT, it varies from address to address. In its data write test, the flash memory is judged as non-defective when data can be written into all desired memory cells within a prescribed number of times the write operation is carried out. The same is true of a data erase test; the memory is judged as non-defective when data can be erased from all desired memory cells within a prescribed number of times the erase operation is carried out.

FIG. 2 shows the construction of the logical comparison part 40. The logical comparison part 40 includes a plurality of logic comparators $\mathbf{4}_1$ through $\mathbf{4}_n$ which are each supplied with the read-out data RD from one of the memories $MUT_1$ through $MUT_n$ and compare it with the expected data ED, and an all-pass detector 43 formed by a NOR gate. In this example, the logic comparators $\mathbf{4}_1$ through $\mathbf{4}_n$ each compare the result of an analog logical decision at the timing of the strobe of input data with the expected data ED by a mismatch detecting circuit 4X formed by an XOR gate; the logic comparator outputs a "0" or "1" depending upon whether they match (PASS) or not (FAIL). FAIL/PASS STATUS data (hereinafter referred to simply as F/P data), which is the result of comparison by each of the logic comparators $\mathbf{4}_1$ through $\mathbf{4}_n$, is provided to the fail analysis memory 5 and, at the same time, it is fed to the all-pass detector 43, from which an all match (all PASS) signal "1" as a match flag MF to the pattern generator 2.

In the simultaneous, parallel testing of a plurality of flash memories, when the read-out data RD from every one of the flash memories $MUT_1$ through $MUT_n$ match the expected data ED in connection with a certain address, a match flag sense instruction is used to generate the match flag MF. The pattern generator 2 responds to the match flag MF to proceed to the next address; when no match exist even in one of the flash memories $MUT_1$ through $MUT_n$, the data write test (or data erase test; the following description will be given only of the case of making the data write test) is carried out again. The program used is designed so that when no match is detected within a prescribed number of times the data write test is repeatedly carried out, the current processing routine jumps to another one, in which the flash memory MUT concerned is stored as a failing memory in the corresponding address of the fail analysis memory and the test proceeds to the next address.

Incidentally, the flash memory has an excessive write protect feature which prohibits a rewrite in an address in which data has already been written successfully. Now, in the case of simultaneously testing the flash memories $MUT_1$ through $MUT_n$ in parallel, since the flash memories MUT each require a different number of times the data write operation is carried out to write therein data as referred to above, if a rewrite is effected in a flash memory MUT at an address yet to be written, the rewrite operation will also be carried out in the other flash memories MUT at the corresponding addresses where data has already been written—this does not conform to the excessive write protect requirements. Similarly, the data erase test also needs to meet an excessive erase inhibit requirement.

For the reasons given above, it is impossible at present to do simultaneous, parallel testing of a plurality of flash memories.

SUMMARY OF THE INVENTION

An object of the present invention is to provide semiconductor memory testing equipment which permits write and erase tests of semiconductor memories without bringing about the excessive write and excessive erase mentioned above.

The semiconductor memory testing equipment according to the present invention comprises: pattern generating means which generates, under the control of a program which determines the pattern generating sequence, an address pattern for specifying an address of a memory under test, a test data pattern to be written into the specified address of the memory under test, expected data to be compared with read-out data from the written address of the memory under test and a control signal to be applied to the memory under testing, the control signal containing an operating state control signal which controls the operating state of the memory under test, and the test data pattern, the address pattern and the control signal from the pattern generating means being applied to the memory under test; comparison means which compares the read-out data from the memory under test with the expected data and outputs a comparison signal which indicates PASS or FAIL depending upon whether they match or not; inhibit signal holding means which, when a match is detected by the comparison means, holds the comparison signal and outputs it as an inhibit signal; and inhibit gate means which responds to the inhibit signal to inhibit the passage therethrough of the operating state control signal to the memory under test, thereby preventing an excessive write in the memory.

BEST MODE FOR CARRYING OUT THE INVENTION

Figure 1:
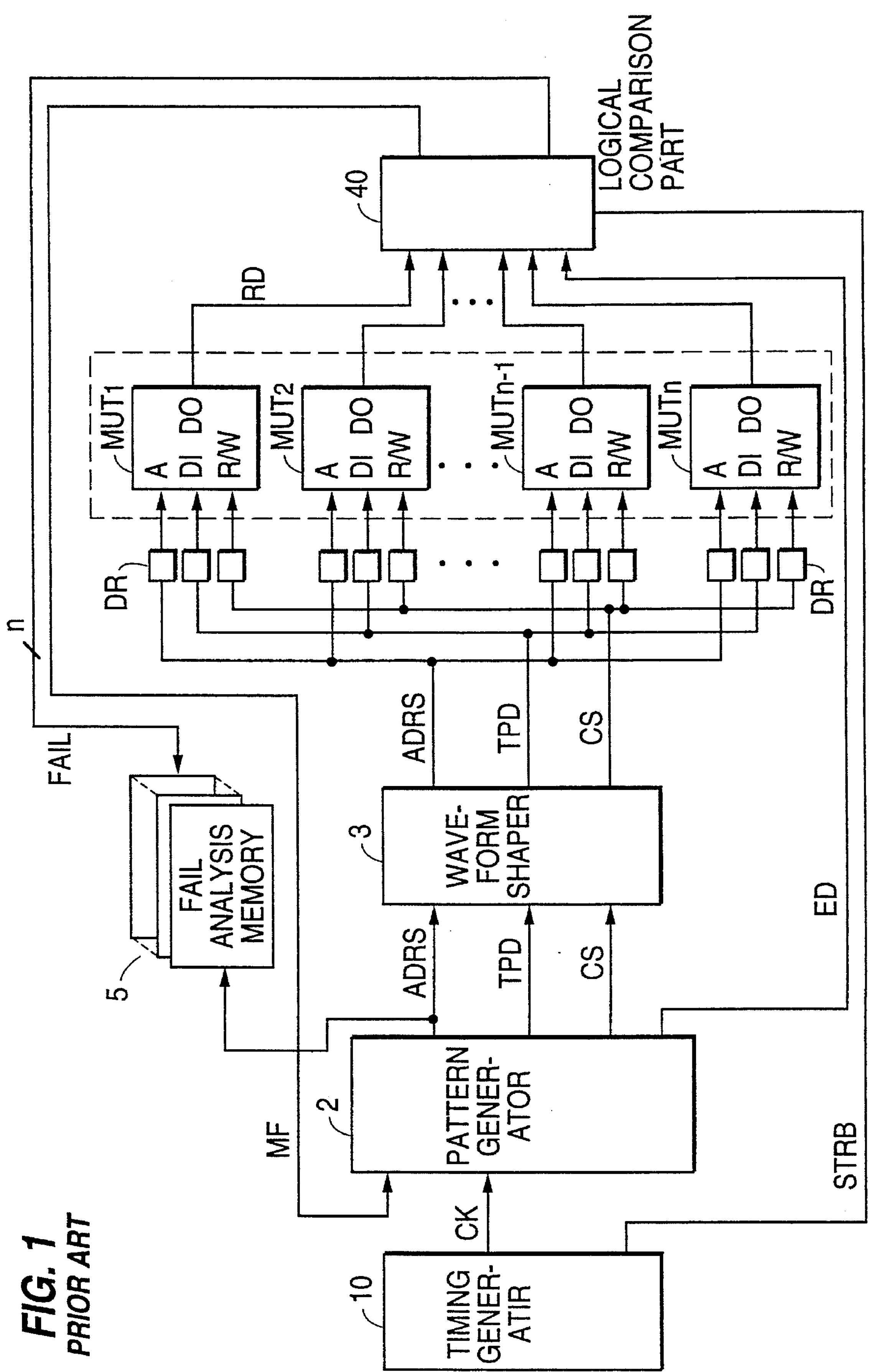
FIG. 1 is a block diagram showing an example of a conventional semiconductor memory test equipment.
Figure 2:
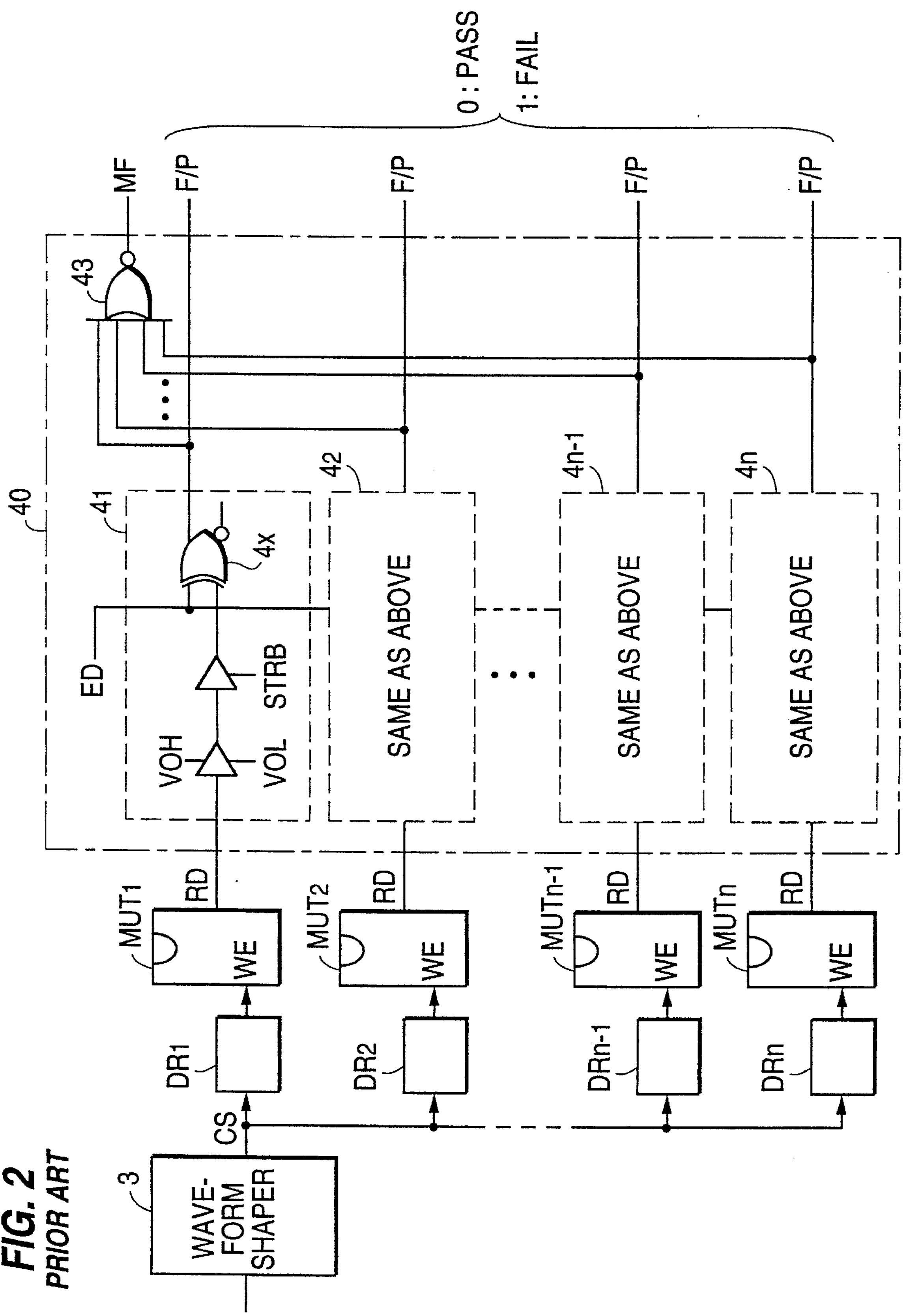
FIG. 2 is a block diagram showing the construction of a logical comparison part 40 in FIG. 1.
Figure 3:
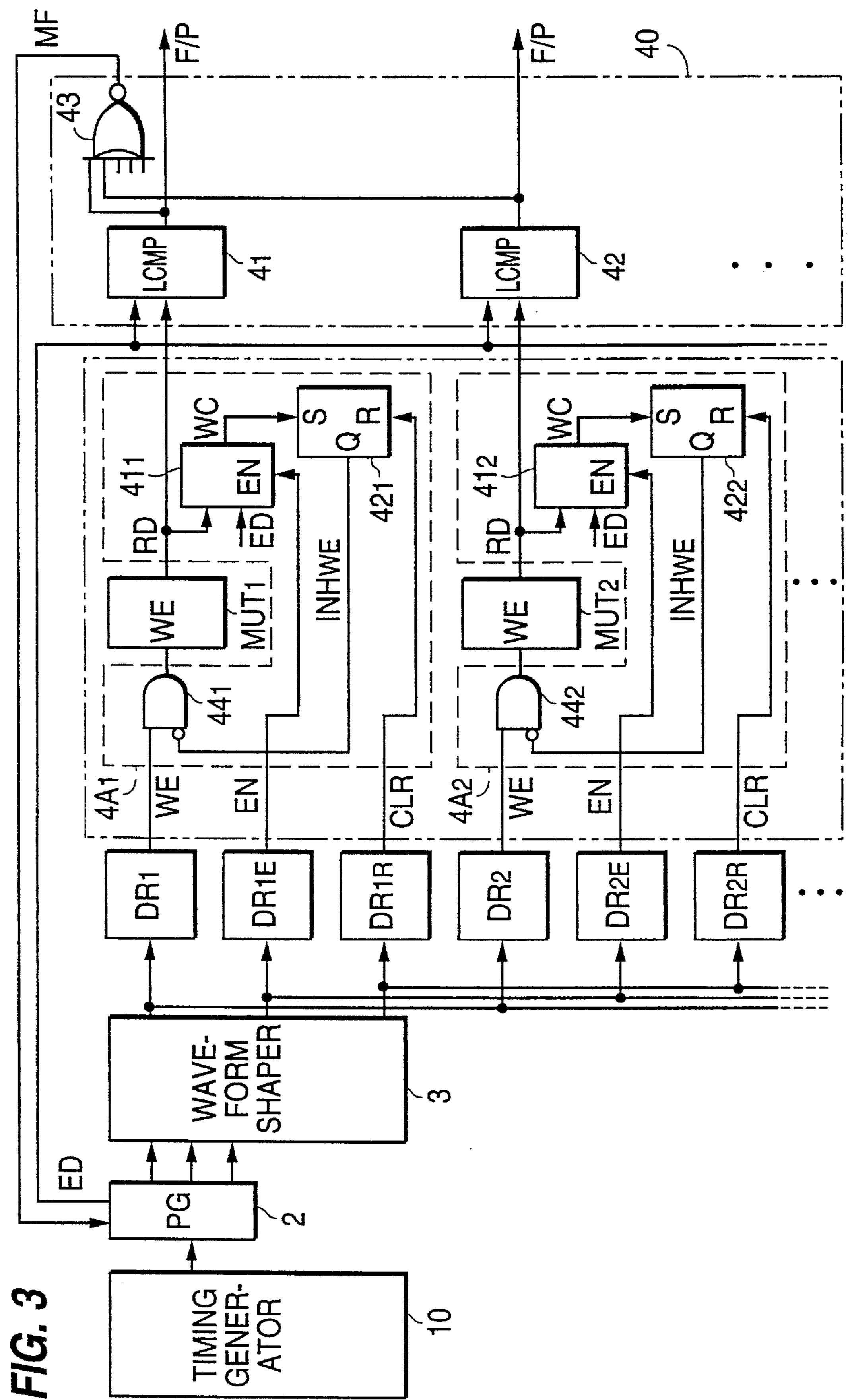
FIG. 3 is a block diagram illustrating an embodiment which prevents an excessive write according to a first aspect of the present invention.

FIG. 3 illustrates in block form an embodiment of the semiconductor memory testing equipment according to the present invention. The testing equipment of this embodiment is so constructed that additional circuits $4A_1$, $4A_2$, . . . $4A_n$ are further provided to the existing semiconductor memory testing equipment, which has the same generator 10, the same pattern generator 2, the same waveform shaper 3, the same logical comparison part 40 and the same all-pass detector 43 as those shown in FIG. 1; The additional circuits $4A_1$, $4A_2$, . . . $4A_n$ are externally mounted to the testing equipment corresponding to the memories $MUT_1$, $MUT_2$, . . ., $MUT_n$, respectively. The logic comparators $4_1$, $4_2$, . . . in the logical comparison part 40 are identical in construction with those in FIG. 2. With a view to simultaneously testing a number of semiconductor memory ICs each having a number of terminal pins, the semiconductor memory testing equipment is primarily designed so that the address pattern data, the test pattern data and the control signal, which are outputted from the waveform shaper 3, are each provided to one of a plurality of desired drivers DR via a pin electronics circuit not shown. The illustrated embodiment is the case where the additional circuits $4A_1$, $4A_2$, . . . are connected to some of such drivers. In FIG. 3 there are not shown connections for the address pattern data and the test pattern data.

As shown in FIG. 3, the additional circuits $4A_1$, $4A_2$, . . . respectively have, in the stages preceding the memories $MUT_1$, $MUT_2$, . . . , write enable inhibit gates $44_1$, $44_2$, . . . , to which write enable signals WE applied from drivers $DR_1$, $DR_2$, . . . Write end detectors $41_1$, $41_2$, . . . , each formed by a comparator, are provided, which are supplied at one input end with the read-out data RD from the memories under test and at the other input end with the expected data ED from the pattern generator 2 and each of which, when supplied with an enable signal EN from a corresponding one of drivers $DR_{1E}$, $DR_{2E}$, . . ., detects the completion of write by detecting a coincidence between the two pieces of input data and outputs a detected signal WC. Write end registers $42_1$, $42_2$, . . ., each formed by a flip-flop, are set by the write end detected signals WC and generate and provide write enable inhibit signals $INH_{WE}$ to inverting inputs of the write enable inhibit gates $44_1$, $44_2$, . . ., and the write end registers are reset by a clear signal CLR which is generated by the pattern generator 2 immediately prior to each address updating and provided via drivers $DR_{1R}$, $DR_{2R}$, . . . Consequently, the write enable inhibit gates $44_1$, $44_2$, . . . are always held enabled open but disabled or closed upon generation of the write end detected signal WC and are enabled again immediately prior to the address updating.

Since the write enable inhibit gates $44_1$, $44_2$, . . . are thus disabled in response to the detection of the completion of write operations, it is possible to inhibit a further write in the specified address once a write is effected therein.

Figure 4:
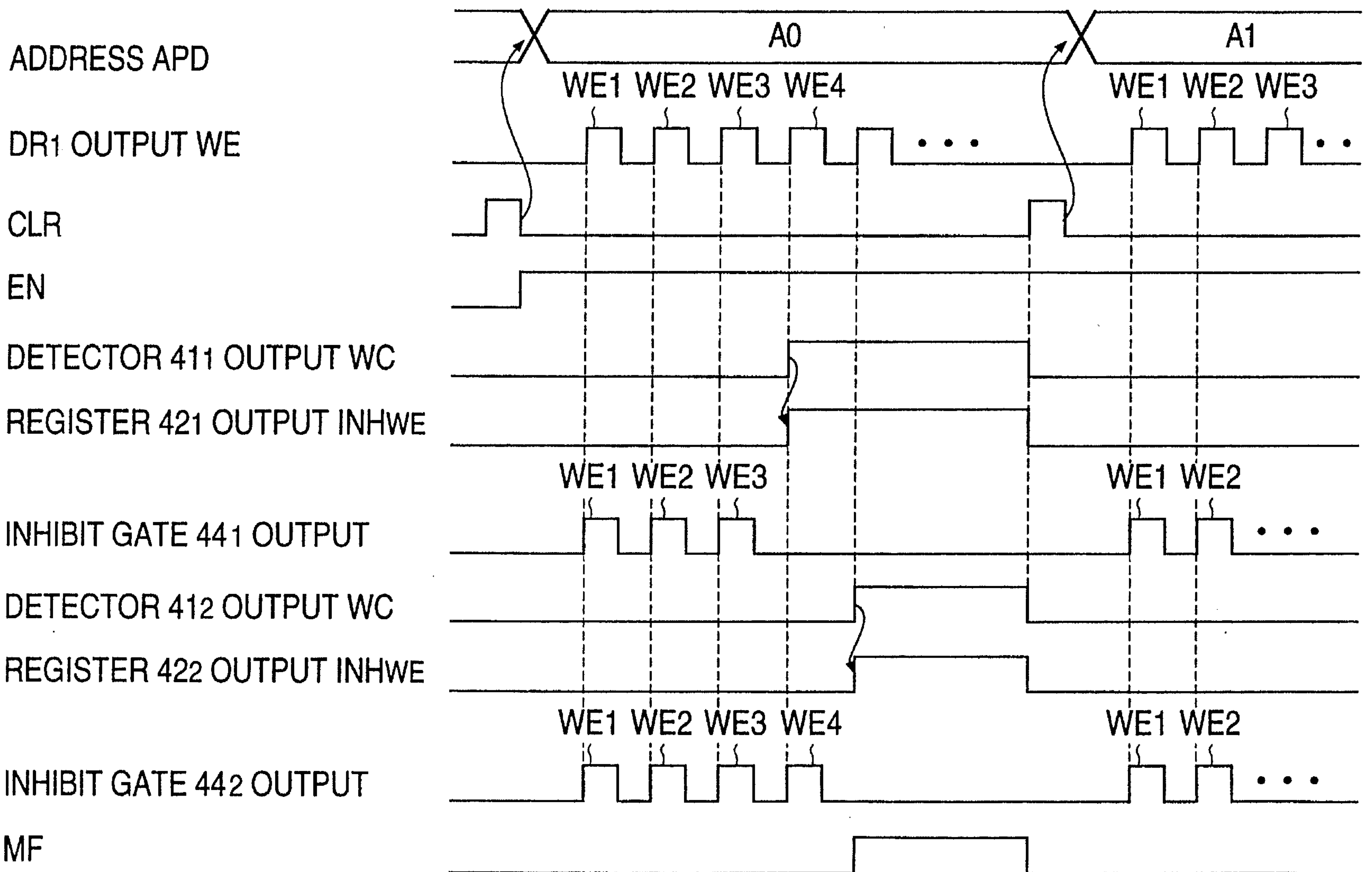
FIG. 4 is a timing chart for explaining the operation of the FIG. 3 embodiment.

FIG. 4 is a timing chart of the operation of the embodiment depicted in FIG. 3. The pattern generator 2 generates the clear signal CLR immediately prior to the address generation and applies it to the write end registers $42_1$, $42_2$, . . . to reset them, furthermore, it generates and applies the enable signal EN to the write end detectors $41_1$, $41_2$, . . . to put them in their operative state. Then, the pattern generator 2 generates an address A0 and, at the same time, generates write enable signals WE1, WE2, . . . for the address. These write enable signals are applied to the memories $MUT_1$, $MUT_2$, . . . via the inhibit gates $44_1$, $44_2$, . . . The illustrated example is the case where the read-out data RD from the memory $MUT_1$ matches the expected data ED after the write enable signal is applied to the memory three times, that is, after the write operation is carried out three times. Upon detecting the match, the write end detector $41_1$ applies the write end detected signal WC to the write end register $42_1$ to set it. The write end detected signal WC is fed as the write enable inhibit signal $INH_{WE}$ to the inhibit gate $44_1$ to disable it. As the result of this, the subsequent write enable signals WE4, . . . are inhibited with respect to the memory $MUT_1$, and hence no further write is effected in the address A0.

On the other hand, the memory $MUT_1$ is shown to be written upon by a fourth write operation; let it be assumed that all the other memories under test, not shown, also have been written upon by the end of the fourth write operation. Accordingly, at the end of the write operation by the write enable signal WE4, the outputs from all the logic comparators $4_1$, $4_2$, . . . are in the PASS state and the all-pass detector 43 outputs the match flag MF ("1"). The pattern generator 2 responds to the match flag MF to generate the clear signal CLR and updates the address to A1, after which the same write test as described above is repeated.

As described above, upon detecting the completion of the write in each address by the write end detectors $41_1$, $41_2$, . . ., the subsequent write operation for the address is inhibited, and hence the excessive write can be prevented. Similarly, the excessive erasure can also be avoided.

Figure 5:
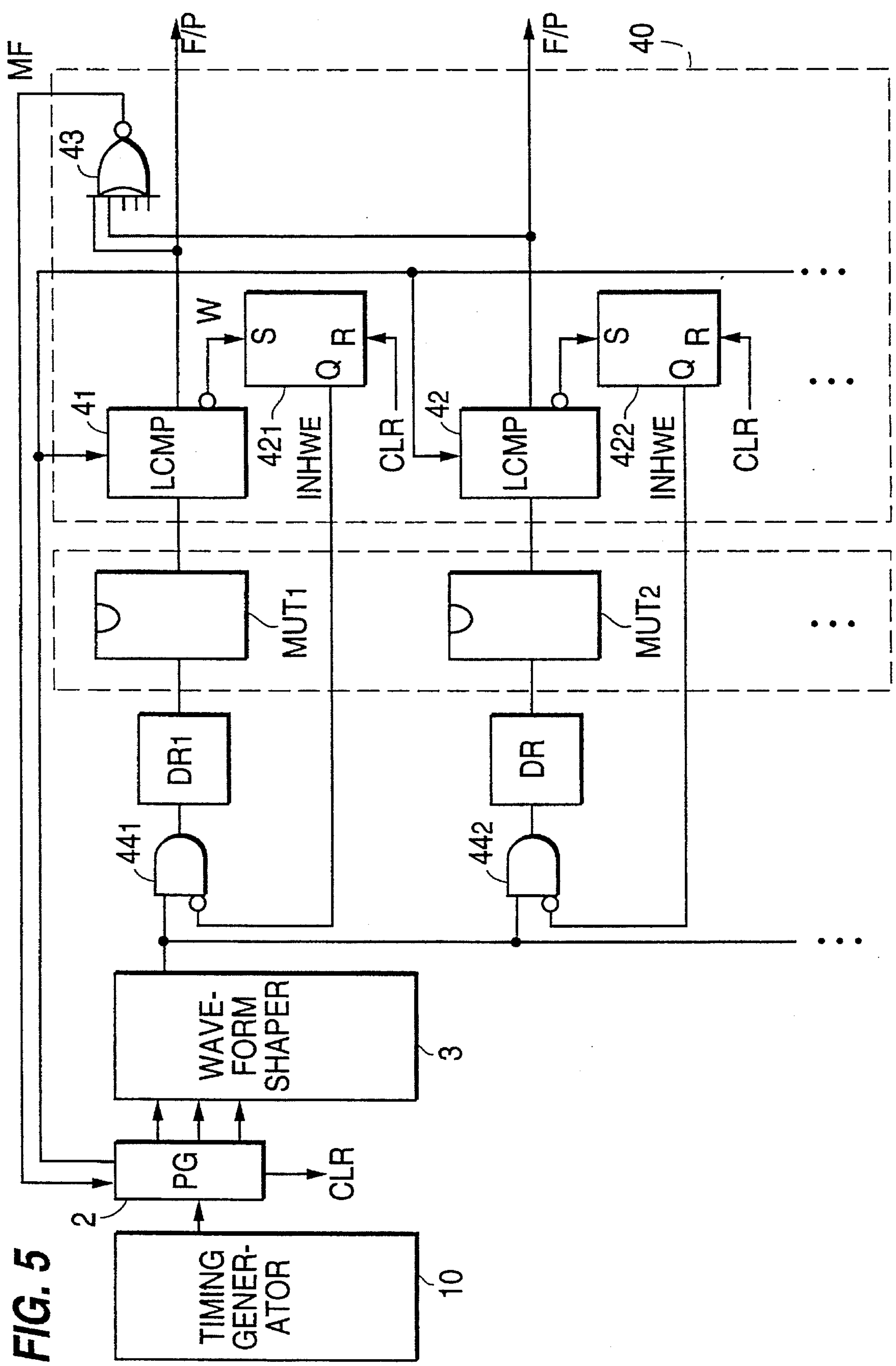
FIG. 5 is a block diagram illustrating another embodiment according to the first aspect of the invention.

While in the FIG. 3 embodiment the additional circuits $4A_1$, $4A_2$, . . . are added to the existing semiconductor memory testing equipment, it is also possible to construct semiconductor memory testing equipment in which the circuits corresponding to the additional circuits $4A_1$, $4A_2$, . . . are incorporated as logical circuits, as shown in FIG. 5.

In the FIG. 5 embodiment, the logic comparators $4_1$, $4_2$, . . . are used also as the write end detectors $41_1$, $41_2$, . . . which are additional circuits in FIG. 3, and inverted outputs from the XOR gates 4X (see FIG. 2) in the logic comparators $4_1$, $4_2$, . . . are provided as the write end detected signals WC to set terminals of the write end registers $42_1$, $42_2$, . . . In addition, the inhibit gates $44_1$, $44_2$, . . . are shown to be provided at the input side of the drivers $DR_1$, $DR_2$, . . ., not at the output side thereof. This embodiment is identical in construction with the FIG. 3 embodiment except the above. Although the embodiments of FIGS. 3 and 5 have been described in connection with the case of inhibiting the write enable signal from being supplied to write enable terminals of the memories $MUT_1$, $MUT_2$, . . ., $MUT_n$ to inhibit data from being written therein, it is also possible to employ a construction which inhibits chip select signals which are applied to chip select terminals of these memories. The chip select terminal is provided in an ordinary semiconductor IC device to effect ON-OFF control of the power supply applied thereto whereby the IC device can be controlled in or out of operation.

I claim:

1. An apparatus for testing semiconductor memories, comprising:

pattern generating means for generating, in accordance with a program for determining a sequence of pattern generation, an address pattern of a series of address signals each specifying an address of a memory under test, a test data pattern of a series of test data signals to be written into addresses of the memory under test specified by said address signals, an expected data to be compared with a test data signal read out of a specified address of said memory under test, and a control signal for controlling the operation of said memory under test, and for applying said test data pattern, said address pattern, and said control signal to said memory under test, said control signal including an operation status control signal for controlling a write/read operation of data into/out of said memory under test;

logic comparison means, receiving data read out of said memory under test and said expected data, for comparing said data from said memory under test with said expected data and outputting a signal that represents a pass when said data from said memory under test match with said expected data or outputting a signal that represents a fail when said data from said memory under test does not match with said expected data;

comparing means, receiving data read out of said memory under test and said expected data, for comparing said data from said memory under test with said expected data and outputting a write end signal that represents a completion of a write when said data from said memory under test match with said expected data;

inhibit signal holding means, connected to the output side of said comparing means, for holding said write end signal when received from said comparing means and outputting said write end signal as an inhibit signal; and inhibit gate means, connected between said pattern generating means and said memory under test, for inhibiting, when said inhibit signal is received from said inhibit signal holding means, said operation status control signal from being supplied to said memory under test to prevent said test data pattern from being written into said memory under test.

2. The apparatus as set forth in claim 1, wherein said pattern generating means applies said test data pattern, said address pattern, and said control signal to a plurality of test channels in parallel, respectively, each test channel comprising said inhibit gate means, said memory under test, said logic comparison means, said comparing means and said inhibit signal holding means, and further comprising:

all-match detecting means, receiving signals outputted from all of said respective logic comparison means in respective test channels, for outputting a match flag to said pattern generating means when all the signals from said respective logic comparison means are pass signals, and wherein said pattern generating means controls the pattern generating sequence depending upon whether or not the match flag is supplied thereto.

3. The apparatus as set forth in claim 2, wherein said pattern generating means, said plurality of logic comparison means, and said all-match detecting means are incorporated into said testing equipment, said plurality of memories under test are connected to said testing equipment so that said test data pattern can be concurrently supplied to said plurality of memories under test from said testing equipment and the data read out of said memories under test can be fed to said testing equipment, and said inhibit gate means, said comparing means and said inhibit signal holding means are constituted as an external additional circuit with respect to said testing equipment.

4. The apparatus as set forth in claim 2, further comprising:

waveform shaping means, connected to an output side of said pattern generating means, for shaping said test data pattern supplied from said pattern generating means into a desired logical waveform; and a plurality of driver means, each converting said test data pattern received from said waveform shaping means into a real waveform having a desired voltage, and wherein said plurality of inhibit gate means are positioned between said waveform shaping means and the corresponding driver means, respectively.

5. The apparatus as set forth in claim 3, further comprising:

waveform shaping means, connected to an output side of said pattern generating means, for shaping said test data pattern supplied from said pattern generating means into a desired logical waveform; and a plurality of driver means, each converting said test data pattern received from said waveform shaping means into a real waveform having a desired voltage, and wherein said plurality of inhibit gate means are positioned between said waveform shaping means and the corresponding driver means, respectively.

6. An apparatus for testing semiconductor memories, comprising:

pattern generating means for generating, in accordance with a program for determining a sequence of pattern generation, an address pattern of a series of address signals each specifying an address of a memory under test, a test data pattern of a series of test data signals to be written into addresses of the memory under test specified by said address signals, an expected data to be compared with a test data signal read out of a specified address of said memory under test, and a control signal for controlling the operation of said memory under test, and for applying said test data pattern, said address pattern, and said control signal to said memory under test, said control signal including an operation status control signal for controlling a write/read operation of data into/out of said memory under test;

logic comparison means, receiving data read out of said memory under test and said expected data, for comparing said data from said memory under test with said expected data and outputting a signal that represents a pass when said data from said memory under test match with said expected data or outputting a signal that represents a fail when said data from said memory under test does not match with said expected data, said logic comparison means further outputting a write end signal that represents a completion of a write when said data from said memory under test match with said expected data;

inhibit signal holding means, connected to the output side of said logic comparison means, for holding said write end signal when received from said logic comparison means and outputting said write end signal as an inhibit signal; and inhibit gate means, connected between said pattern generating means and said memory under test, for inhibiting, when said inhibit signal is received from said inhibit signal holding means, said operation status control signal from being supplied to said memory under test to prevent said test data pattern from being written into said memory under test.

7. The apparatus as set forth in claim 6, wherein said pattern generating means applies said test data pattern, said address pattern, and said control signal to a plurality of test channels in parallel, respectively, each test channel comprising said inhibit gate means, said memory under test, said logic comparison means and said inhibit signal holding means, and further comprising:

all-match detecting means, receiving signals outputted from all of said respective logic comparison means in respective test channels, for outputting a match flag to said pattern generating means when all the signals from said respective logic comparison means are pass signals, and wherein said pattern generating means controls the pattern generating sequence depending upon whether or not the match flag is supplied thereto.

8. The apparatus as set forth in claim 7, further comprising:

waveform shaping means, connected to an output side of said pattern generating means, for shaping said test data pattern supplied from said pattern generating means into a desired logical waveform; and a plurality of driver means, each converting said test data pattern received from said waveform shaping means into a real waveform having a desired voltage, and wherein said plurality of inhibit gate means are positioned between said waveform shaping means and the corresponding driver means, respectively.

* * * * *